(12) United States Patent
Rapport et al.

(10) Patent No.: US 6,282,210 B1
(45) Date of Patent: Aug. 28, 2001

(54) CLOCK DRIVER WITH INSTANTANEOUSLY SELECTABLE PHASE AND METHOD FOR USE IN DATA COMMUNICATION SYSTEMS

(75) Inventors: Russell Rapport; Jeff Buchle, both of Austin, TX (US)

(73) Assignee: Staktek Group L.P., Austin, TX (US)

( * ) Notice: Subject to any disclaimer, the term of this patent is extended or adjusted under 35 U.S.C. 154(b) by 0 days.

(21) Appl. No.: 09/133,297

(22) Filed: Aug. 12, 1998

(51) Int. Cl.[7] .................................................. H04J 3/06
(52) U.S. Cl. ........................ 370/518; 370/516; 375/376
(58) Field of Search ................... 370/516–519; 375/328, 371, 373, 375, 376; 331/14

(56) References Cited

U.S. PATENT DOCUMENTS

| | | | |
|---|---|---|---|
| 4,457,005 | * 6/1984 | Burke et al. | 375/328 |
| 5,126,693 | * 6/1992 | Gulliver et al. | 331/14 |
| 5,361,277 | 11/1994 | Grover | 375/107 |
| 5,463,337 | 10/1995 | Leonowich | 327/158 |
| 5,604,775 | 2/1997 | Saitoh et al. | 375/376 |
| 5,657,481 | 8/1997 | Farmwald et al. | 395/551 |

OTHER PUBLICATIONS

Jeff Sonntage, Robert Leonowich, "Session 11: High–Speed Communication IC's; FAM 11.5: A Monolithic CMOS 10MHz DPLL for Burst–Mode Data Retiming," *IEEE International Solid–State Circuits Conference*, 1990, pp. 194–195 and 294.

IBM Corporation, "32M×72 2 Bank Registered SDRAM Module," *IBM Preliminary*, Apr. 1998, pp. 1–19.

IBM Corporation, "168 Pin SDRAM Registered DIMM Functional Description and Timing Diagrams," *IBM Preliminary*, Jan. 1998, pp. 1–48.

IBM Corporation, "16Mb Synchronous DRAM–Die Revision E," *IBM Preliminary*, Apr. 1998, pp. 1–118.

\* cited by examiner

*Primary Examiner*—Salvatore Cangialosi
(74) *Attorney, Agent, or Firm*—George + Donaldson LLP; J. Scott Denko

(57) ABSTRACT

A clock driver providing a clock signal, from an input clock signal, that has instantaneously selectable phase and methods for synchronizing data transfers in a multi-signal bus communication system. A clock driver of the present invention generates an output clock signal from an input clock signal having a periodic wave form and provides the flexibility for selecting or changing the magnitude of the phase-offset of the output clock signal, in relationship to the input clock signal, for desired clock periods and optionally desired half-clock periods. A method is provided for the self-calibration of critical delay elements. The present invention also includes a method for synchronizing data transfers between a bus master device that is clocked by a system clock and a plurality of synchronous DRAM devices (SDRAM) that are clocked by a local clock; the local clock has, in relationship to the system clock signal, a first phase-offset for read cycles and a second phase-offset for write cycles. A Dual In Line Module (DIMM) of the present invention receives a system clock signal and provides a local clock signal to an array of SDRAM devices, wherein the local clock signal has, in relationship to the system clock signal, a first phase-offset for read cycles and a second phase-offset for write cycles. Optionally the magnitude of the phase-offset of the local clock signal is selectable through software providing the flexibility to support a method for determining the optional phase-offsets by software using an iterative process involving trial and error.

12 Claims, 12 Drawing Sheets

CLOCK DRIVER WITH INSTANTANEOUSLY SELECTABLE PHASE AND METHOD FOR USE IN DATA COMMUNICATION SYSTEMS

BACKGROUND OF THE INVENTION

Dual In Line Memory Modules (DIMM) specifications define a modular memory device comprising small Printed Wiring Boards (PWB) boards with an array of memory devices. DIMM achieve high-speed data transfer rates of up to 100 Mhz in part by using an architecture that synchronizes the output data from the DIMM to a system clock. DIMMS with Synchronous Dynamic Random Addressable Memory (SDRAM) utilize clock signals provided to each DIMM for synchronization. DIMM modules with SDRAM having bus transfer rates of 66 MHz and above typically require about 1 ns worst case clock skew between the clock to the DIMM and clock to the SDRAM. DIMM modules commonly use a phase-lock-loop (PLL) circuit on each DIMM to re-drive the clock signals to both the memory devices and registers to minimize system clock loading and to provide low skew between input and output clock signals.

Timing error resulting from clock to data skew becomes an increasingly significant factor as memory device speed and bus transfer rates increase. Microprocessor system boards commonly have sockets for two to eight DIMMs and provide a duplicate copy of a single reference clock signal to each DIMM. Typically, the DIMM share a common bidirectional data bus resulting in each DIMM having a different data signal propagation time. Each inch of signal trace typically has more than 1 ns of signal propagation time, and sockets add additional capacitance and inductance that increase the skew in data propagation times between each DIMM.

Allowable timing error margins are reduced as bus transfer rates are increased. When worst case error margins are exceeded, reliability in mass production decreases. Timing problems show up as sporadic system crashes in some systems, which is unacceptable in systems such as servers that require consistent high reliability. DIMM specifications define a board outline and a system interface to provide for interchangeability between DIMMs having different memory device types and manufactures. Different types of DIMNs will have different AC characteristics, such as the data pin input capacitance and characteristic transmission line impedance that when combined with the variations in the AC characteristics of microprocessor systems boards result in worst case error margins being exceeded when minimum and maximum specifications and electrical characteristics of connectors are considered. Error margins are further reduced when the effects of temperature variations are taken into consideration. Device speeds vary with temperature. Memory systems are becoming increasingly more dependent on precision trace propagation times. Temperature swings of 0° C. to 70° C. results in 10% to 20% change in signal propagation times.

DIMM specifications allow the CAS latency to be varied on read cycles to provide additional clock periods to increase the read cycle time to SDRAM, however, the additional cycles typically results in microprocessor wait states that will degrade system performance. DIMM specifications do not provide flexibility in the number of clock periods in a write memory cycle. For DIMMs having long data propagation paths, a delayed clock signal to the individual SDRAM is needed that will allow additional set up time for the data signal to propagate and settle prior to being sampled; however, a delayed clock will increase the time for the data from the SDRAM on read cycles to reach the microprocessor or, alternately, be latched by a register on the system board requiring increased number of read clock periods to complete the memory read cycles. Phase-lock-loop clock drivers are available that provide selectable phase-offset magnitudes, but the prior art phase-lock-loop drivers do not allow for the phase-offset to be changed instantaneously (within a single clock period) in response to external stimuli. New methods are needed for providing precise and instantaneous phase-offset adjustment of the clock signal to each SDRAM based on the type of bus cycle in progress.

SUMMARY OF THE INVENTION

A clock driver of the present invention provides the flexibility to select, for desired clock periods, the magnitude of the phase-offset of an input clock signal in relationship to an output clock signal for increased reliability or optimal performance. A DIMM module of the present invention receives a system clock signal, has a synchronous memory device SDRAM that receives a local clock signal that is derived from the system clock signal. The local clock signal has a first desired phase-offset, for write cycles, and a second desired phase-offset for read cycles. A memory subsystem of the present invention has a bus master device that is clocked by a system clock signal and a slave memory device that is clocked by a local clock signal. The local clock signal has, for read cycles, a first desired phase-offset in relationship to the system clock signal and, for write cycles, a second desired phase-offset for read cycles.

Preferred embodiments are described herein for a clock driver of the present invention that has a zero-delay loop circuit that generates a reference signal from an input clock signal that is routed through a multiplexer to an output clock signal. A feedback signal is provided to the zero-lock-loop circuit to determine the phase-offset of the reference signal; the zero-lock-loop circuit adjusts the phase-offset of the reference signal until the feedback signal is in-phase with the input clock signal. The feedback signal is a delayed version of the reference signal, where the delay is selected to approximate the cumulative delays of the reference signal through the multiplexer, to the output clock signal, and through the external trace connecting the output signal to an external device, such that when the feedback signal is in-phase with the input clock signal, the signal received by the external device is in-phase with the input clock signal. The multiplexer receives one or more offset signals that are each a delayed version of the reference signal such that each offset signal is staggered in time from one another and the reference signal. A state machine determines which signal received by the multiplexer is routed to the output signal providing flexibility to select the phase-offset of the output signal in relationship to the input signal for select cycles or half cycles.

Alternate embodiments provide self calibration function where some internal delay paths are self-adjusted by the clock driver circuit when the clock driver circuit enters a calibration mode. Gates having low propagation times are selectively closed while select signals are routed to phase-comparator circuits that provide a signal that alters specific delay paths. The calibration function is typically triggered by a software command after a warm-up delay.

The preferred embodiments described herein are designed to provide a local clock signal to an array of synchronous memory devices on a DIMM module having an interface to a bus master device provided by an address bus, a data bus, and a control bus. The state machine tracks the control bus, detects read cycles and write cycles to the DIMM, and selects a first phase-offset for read cycles and a second phase-offset for write cycles. Alternate embodiments provide for the magnitude of phase-offset for read and write signals to be programmed by software providing software programs the flexibility to select the optimal delays by trial and error.

Alternate embodiments provide for three phase-offset set options: a first that is selected for read cycles, a second that is selected for write cycles, and a third that is selected during the transition clock period between two clock periods having different phase-offset, the third phase-offset has a magnitude that is in between the magnitude of the first phase-offset and the magnitude of the second phase-offset, such that the duty cycle of the transition clock period approximates a 50% duty cycle.

A preferred embodiment utilizes a phase-lock-loop circuit that provides an output clock that has a fixed phase-offset from an input clock signal. The output clock signal is routed through a first path and a second path. The second path has a substantially longer propagation time. Both paths are received by an FET bus switch or multiplexer, which selectively routes one of the received inputs to provide a clock signal having a phase-offset selectable from the two options provided by the two received signals. Alternately, a third path can be provided to provide a 50% duty cycle during the transition period. Alternately, a separate phase-lock-loop circuit can drive each path received by the FET switch and optionally the FET switch can be eliminated by using phase-lock-loop circuits that have tri-state outputs.

A microprocessor system of the present invention has synchronous memory devices SDRAM that transfer data information to and from a microprocessor through a data bus. Read and write cycles are synchronized by a system clock signal that determines when data is read and written to the data bus by the microprocessor unit and a local clock signal that determines when data is read and written by the SDRAM. The system clock signal and the local clock signal have a first phase-offset relationship for read cycles and a different second phase-offset relationship for write cycles.

Alternately, the present invention is applicable to any memory subsystem that has a bus-master device such as hard drive or LAN controller, where data transfers are synchronized to a common clock by both the bus-master circuit and the memory device. In these applications, the functions of the Microprocessor Unit (MPU) described herein applies to the bus-master device. The present invention is also applicable to any memory subsystem that has memory devices that use a single clock to synchronize read and write data transfers as well as memory devices such as those used with RAMBUS™ that has two clocks (a transmit clock and a receive clock) where both clocks are used simultaneously for synchronization of both read and write memory operations. In the case of two synchronized clock signals, the phase-offset relationships described herein applies to both clock signals. It will be apparent to those who are skilled in the art of data communication systems, that the methods of the present invention are applicable to any communication system that transfers data between two registers through a multi-signal data bus using a single clock signal for synchronization, such as a PCI Local bus and many backplane-based systems. The two registers of the communication system are the equivalent to the MPU and memory device of following descriptions for purposes of applying the methods of the present invention to the communication system.

DETAILED DESCRIPTION OF THE PREFERRED EMBODIMENTS

Figure 1:
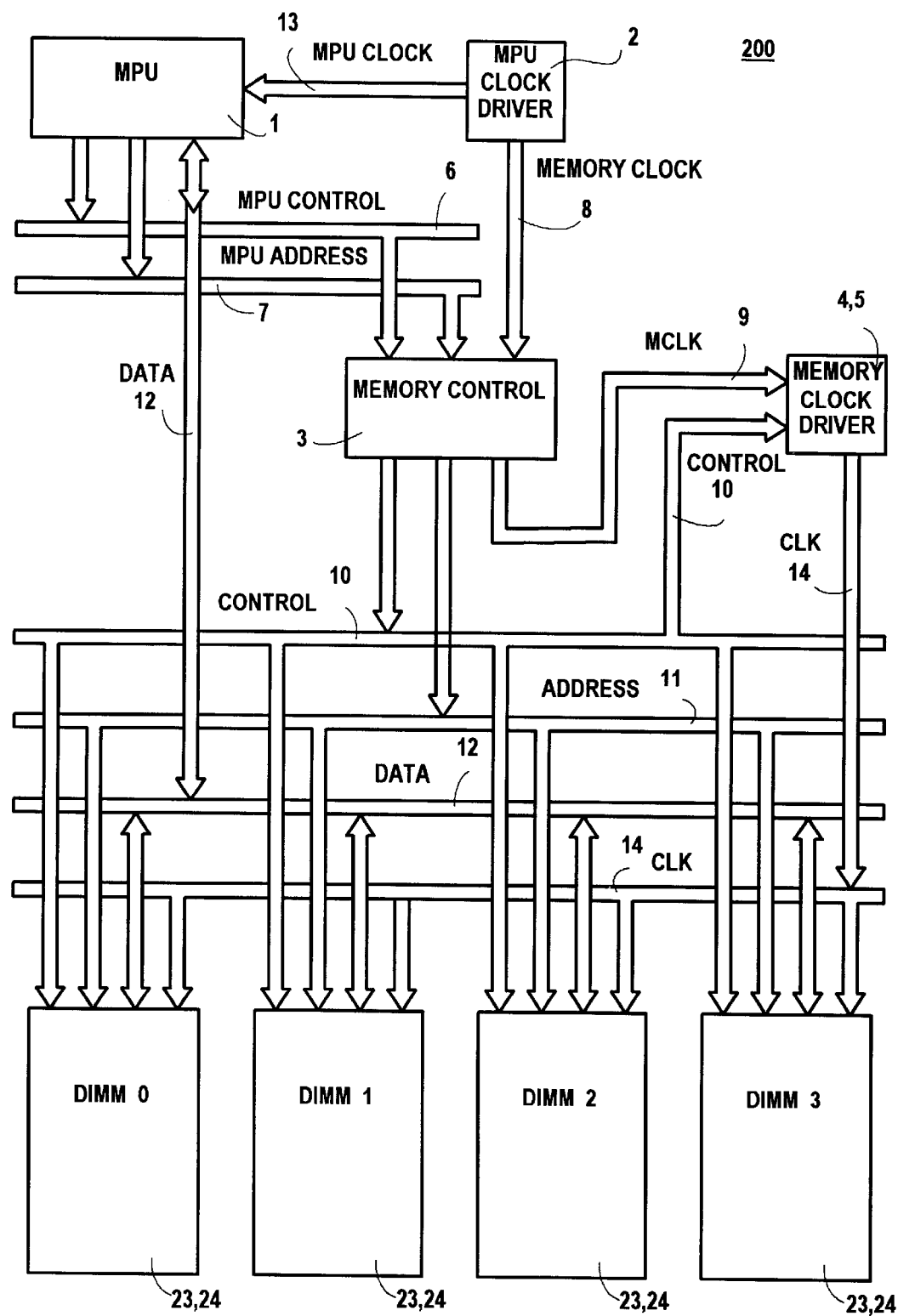
FIG. 1—A block diagram for explaining a microprocessor system of the present invention.
Figure 2:
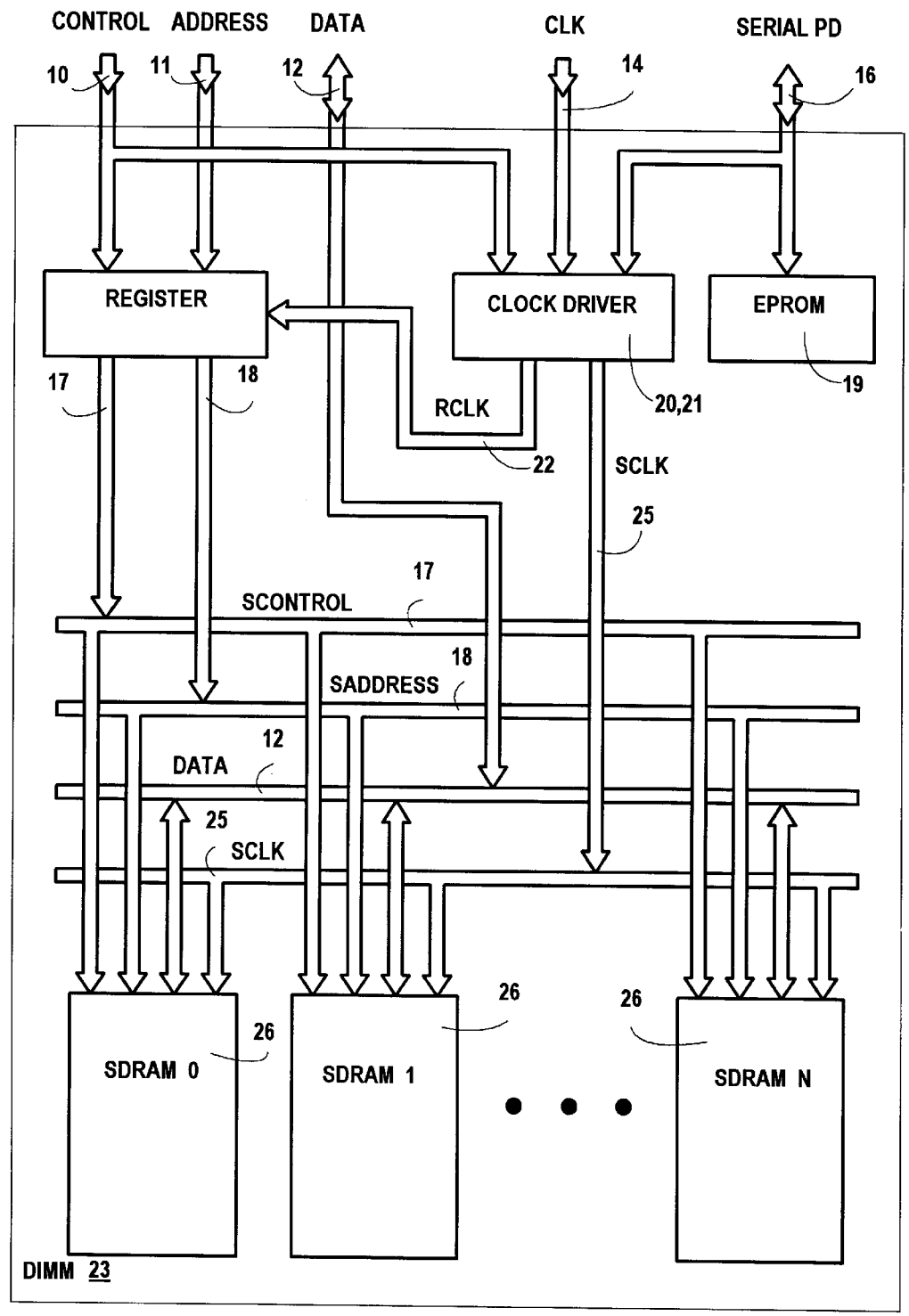
FIG. 2—A block diagram for explaining a memory module (DIMM) of the present invention.

FIGS. 1 and 2 show the relationship of the primary components of a typical microprocessor system 200 of the present invention. MPU CONTROL signal 6 define the operation performed by each microprocessor Unit (MPU) bus cycle and may convey or receive synchronization information. MPU ADDRESS signals 7 select the memory locations to be read or written. DATA signals 12 provide a direct interconnection between MPU 1 and SDRAM for bi-directional transfer of data information. DATA signals 12 may include bus transceivers, transparent latches, and/or FET bus switches which are not shown in FIG. 1. MEMORY CONTROL circuit 3 receives the MPU ADDRESS signals 7 and MPU CONTROL signals 6 and generates multiplexed ADDRESS signals 11 and CONTROL signals 10 that are received by DIMM 23,24 which are shown in more detail in FIG. 2. On each DIMM, CONTROL signals 10 and ADDRESS signals 11 are received by REGISTER 27 that typically adds a delay of at least one CLK 14 period to produce SCONTROL 17 and SADDRESS 18 signals. REGISTER 27 is controlled by a register enable signal (not shown) and a signal RCLK 22. REGISTER 27 and timing of RCLK 22 are selected to guarantee set-up and hold times consistent with reliable operation. In accordance with the methods of the present invention, the transfer timing of the DATA path 12 may be optimized at the expense of timing margins in other areas, such as address set up and hold times. RCLK 22 may be one of the CLK 14 received by the DIMM 23,24 are preferably ADDRESS signals 11 and CONTROL signals 10 may be latched synchronous to CLK 14 and presented to the SDRAM 26 synchronous to SCLK 25. Alternately, RCLK may have a phase-offset that is between the multiple phase-offsets of SCLK 25, which are described later in more detail. DATA signals 12 may have additional transceivers, transparent latches, or FET bus switches (not shown) for reducing the capacitive load.

Typically, a crystal oscillator (not shown) provides an initial fixed frequency clock signal from which the other clock signals are derived. One or more low skew clock buffers, phase-lock-loop clock drivers, or a clock synthesizer (that provides clocks of varying frequency) provide a MPU CLOCK 13 to the MPU, and a system clock MCLK 9, to the MEMORY CONTROLLER 3 that typically have the same frequency and low skew within 300 pico seconds. Each DIMM 23,24 receives four clock signals CLK(3:0) 14 that each has a desired phase-offset relationship to MCLK 13. Each DIMM 23,24 has a clock driver 20,21 that receives one CLK signal 14 and generates an SCLK 25 to each SDRAM device 26 that has a desired phase-offset relationship to MCLK 13.

For write cycles, data signals 12 are driven with valid data by the MPU 1 for time intervals that have set up and hold times that are fixed in relationship to the rising edge of MPU CLOCK 13; accordingly, the time intervals that data is driven by the MPU1 are synchronized to the system clock MCLK 9 which is synchronized with MPU CLOCK 13. DATA signals 12 are latched by the selected SDRAMs 64 on a rising edge of SCLK 25; accordingly, valid data must maintain setup and hold times that are fixed in relationship to SCLK 25. For read cycles, DATA signals 12 are driven with valid data by the individual SDRAM 26 for time intervals that are synchronous to SCLK 25, and the DATA signals 12 are latched by the MPU 1 on the rising edge of MPU CLOCK 13 and have set up and hold times that are fixed in relationship to MCLK 9. Specific methods of the present invention adjust the phase of each DIMM 23 local clock SCLK 25 in relationship to the system clock MCLK 9 for select cycles resulting in either improved performance or increased reliability. Specific methods described herein provide for a first desired phase relationship between SCLK 25 and MCLK 9 for read cycles and a second desired phase-shift relationship between SCLK 25 and MCLK 9 for write cycles. In the preferred embodiments described herein, either the MEMORY CLOCK DRIVER 4 provides the alternating phase-shift relationship using standard DIMMs 24, or a CLOCK DRIVER 20, on each DIMM 23 that provides the alternating phase-shift relationship using a standard MEMORY CLOCK DRIVER 5.

Figure 3:
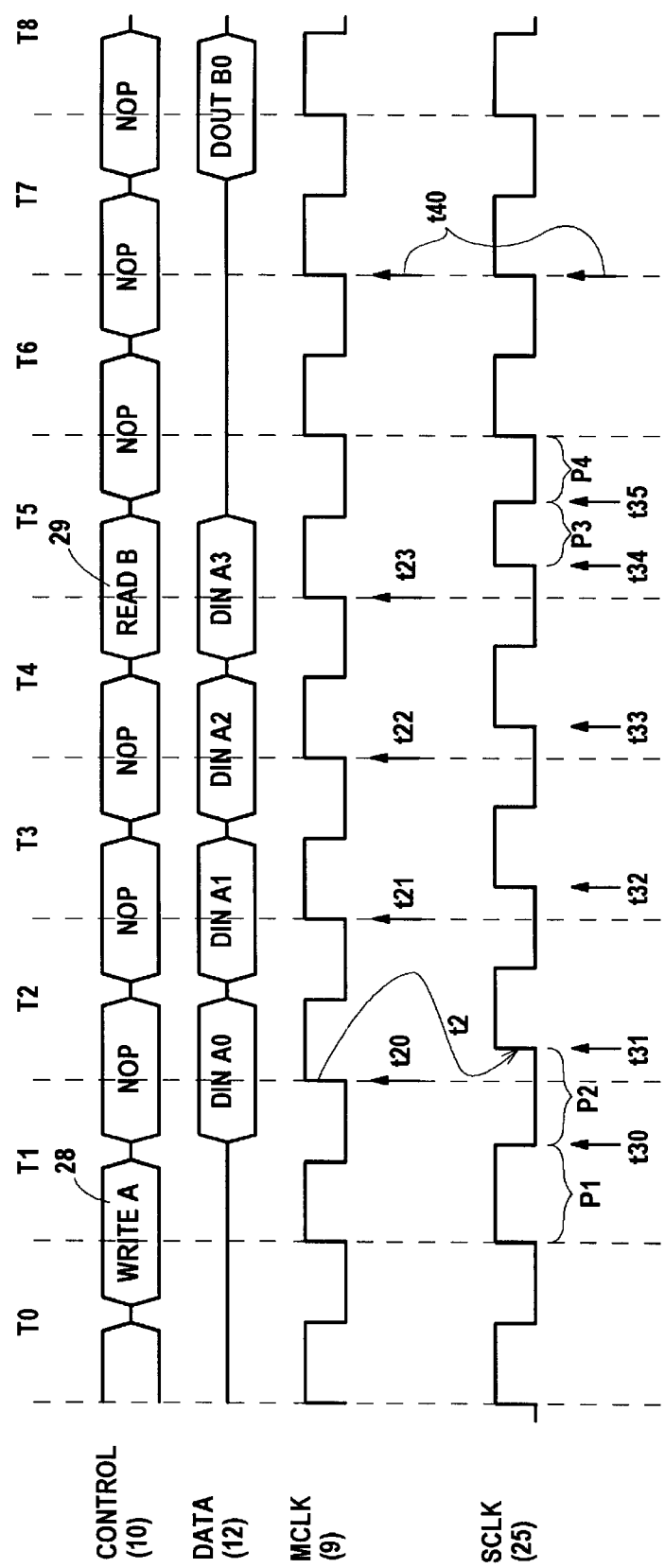
FIG. 3—A timing diagram for explaining a microprocessor system and DIMM of the present invention.

FIG. 3 shows a burst write cycle followed by a single read cycle that is in accordance with the methods of the present invention. SCLK 25 is delayed on write cycles during T2, T3 and T4 resulting in increased time t2 for signal transitions to propagate along the DATA signals 12 and stabilize prior to being sampled by the selected SDRAM 26. For 100 MHz memory bus systems, delay t2 is typically selected to be 50 pico seconds to 2 nano seconds; however, smaller delays may be effective as circuit speeds increase and the delay can be as much as the period of SCLK 25. A 50 pico second selection for the t2 delay on write cycles makes the difference between reliable operation and intermittent write errors on some combinations of system boards 200 and DIMMs 23,24. Read cycles, of this specific embodiment of the present invention, have SCLK 25 clock signals (at the point each is received by the SDRAM 26) that are nominally in-phase ( with accuracy limited to about + or −1 ns ) with MCLK 13 and CLK14 (at the point each is received by the DIMM 23,24). It is not desirable in this embodiment to have an SCLK 25 delayed for read cycles in the same manner as it is delayed for write cycles; delaying SCLK 25 reduces the interval from the time DATA signals 12 are driven by the selected SDRAM 26 to the time DATA signals 12 are sampled by the MPU 1.

In system clock period T0 of FIG. 3, the MEMORY CONTROL circuit 3, in response to a MPU 1 cycle, initiates a burst write cycle to a selected SDRAM 26 by placing write command 28 on the CONTROL bus 10. In each of the four periods that follow, T1 through T4, the MPU 1 drives data information DIN A0 through DIN A3 on DATA signals 12 for time intervals that are synchronized to MCLK 9. The selected SDRAM 26 reads DATA signals 12 on each of the rising edges t31 through t34 of periods T2 through T5. Each of the rising edges t31 through t34 of SCLK 25 (at the point each is received by an SDRAM 26) occurs a t2 amount of time following the corresponding rising edges t20 through t23 of MCLK 9 resulting in increased setup time t2 prior to DATA signals 12 being read. The proceeding falling edge t30 of SCLK 25 occurs at a time that maintains an approximate 50% duty cycle for SCLK 25 in the T1 period. Immediately following the write cycle, the MEMORY CONTROL circuit 3, in response to a MPU cycle 1, initiates a read cycle by placing read command 29 on the CONTROL signals 10 in period T4. The rising edge of SCLK 25 for periods T6 and T7 occur simultaneously (within an error window of + or −1 ns) with the corresponding rising edge of MCLK 9. The selected SDRAM 26 drives valid data DOUT B0 on the DATA signals 12 in period T7 for a time interval that is synchronous to SCLK 25; accordingly, the time interval is fixed (within allowable error limits) to the rising edge t40 of SCLK 25. The falling edge of SCLK 25 in period T5 occurs at a time t35 such that T5 maintains a 50% duty cycle. Pulse widths P3 and P4 restrict the allowable SDRAM 26 used in this embodiment; SDRAM 26 are commonly available in speeds that are faster than the commonly used bus speeds.

Figure 4:
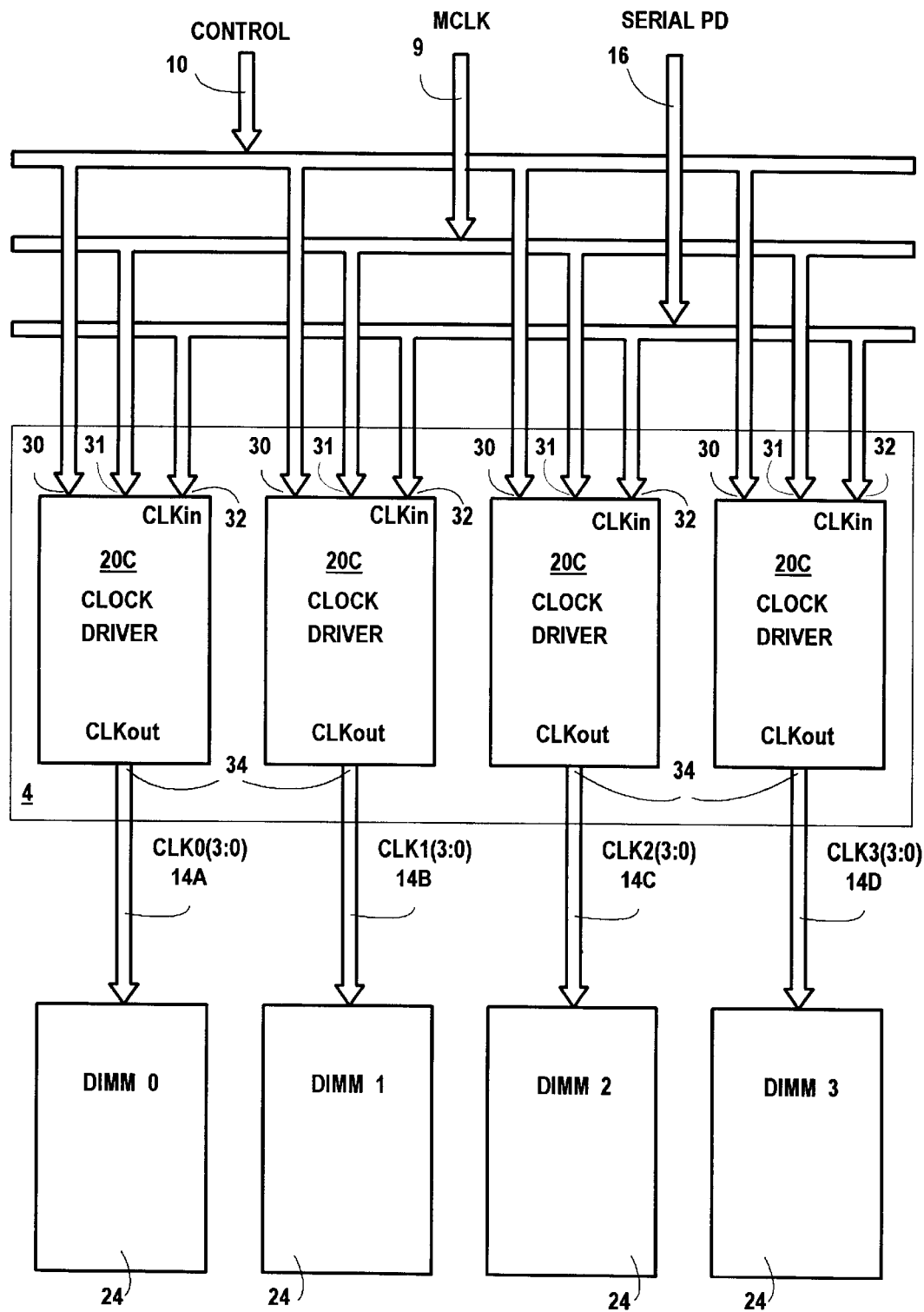
FIG. 4—A block diagram for explaining a microprocessor system of the present invention.

Typically, DIMM 23,24 share a common DATA bus 12 resulting in the DATA bus 12 to each DIMM 24 having different propagation times. On some system boards, optimal memory cycle timing results when the DIMMs 23,24 that are located on the near end of the DATA bus 12 receive CLK(3:0) 14 that are relatively late for read cycles and relatively early for write cycles as compared to other DIMMs 23,24. Conversely, optimally memory cycle timing results when DIMMs that are located on the far end of the DATA bus 12 receive CLK(3:0) 14 that are relatively early on read cycles and relatively late on write cycles as compared to other DIMMs 23,24. In some cases, for select clock periods CLK(3:0) 14 (at the point each is received by DIMM 23,24) precedes MCLK 9. One method of the present invention provides for programming the read and write cycle clock phase relationship for each DIMM 23,24 resulting in increased accuracy and maximum flexibility, including the capacity for dynamic compensation for the effects of temperature on signal propagation times. The preferred embodiment shown in FIG. 4 uses standard DIMMs 24 that drives SCLK 25 using low skew clock buffers rather than phase-lock-loop clock drivers that can lose lock when the phase of the input clock CLK(3:0) changes. The MEMORY CLOCK DRIVER 4 has four programmable CLOCK DRIVERS 20C that each drive a group of CLK(3:0) signals 14A–14D standard that have selectable phase-offset in relationship to system clock MCLK 9. A read cycle phase-offset and a write cycle phase offset is individually programmed for each group of CLKn(3:0) signals 14A–14D. SERIAL PD signals 16, as defined by DIMM 24 specifications, provide a software interface to each CLOCK DRIVER 4 allowing a software program to specify the magnitude of the read and write cycle phase-offset. Alternately, another method of the present invention for achieving this maximum cycle timing flexibility is for each DIMM 23 to use a standard MEMORY CLOCK DRIVER 5 that drives CLK 14 in-phase with MCLK 9, and to use CLOCK DRIVER 20C in each DIMM 23 that has selectable read and write cycle SCLK 25 phase-offsets.

A method of the present invention provides for the dynamic calibration for SCLK 25 and MCLK 9, a first desired phase-shift relationship for read cycles and a second desired phase-shift relationship for write cycles. Calibration is accomplished by a software program running on the active MPU 1 that executes the following steps in the order listed at any time after the system has achieved normal running temperatures: (1) Slow the memory clock MCLK 9 to half speed; (2) Write and then read a select group of addresses on each target DIMM 23,24, to verify correct operation of the target DIMM 23,24 (a full memory data and address test may be run); (3) Restore the memory clock MCLK 9 to full speed; (4) For each target DIMM 23, 24, determine the optimal programmable phase-offset for each associated CLOCK DRIVER 20C for reads by repeating steps 4A through 4E for each select group of available read phase-offset options starting with the minimal offset: (4A) Program the CLOCK DRIVER 20C to select the next read cycle phase-offset option; (4B) Read an address location in the target DIMM 23, 24 that has known data; (4C) Determine if the data read is correct; (4D) Read a second address in the same DIMM 23, 24 that has known different data (to put the data bus on the DIMM 23, 24 into a known state); (4E) Select the read phase-offset option that is the middle of the range of phase-offset options that returned correct data; (5) For each target DIMM 23, 24, determine the optimal programmable phase-offset for each associated CLOCK DRIVER 20C for writes by repeating steps 5A through 5E for each select group of available write phase-offset options starting with the minimal offset: (5A) Program the CLOCK DRIVER 20C to select the next write cycle phase-offset option; (5B) Write to an address location in the target DIMM 23, 24 with known data; (5C) Read a second address in the same DIMM 23, 24 with known different data (to put the data bus on the DIMM 23, 24 into a known state); (5D) Read the location written in step 5B and determine if the data read is correct; and (5E) Select a write phase-offset that is the middle of the range of programmed phase-offsets that returned valid data.

FIGS. 5 through 8 show schematic block diagrams for explaining four different preferred embodiments 23A–23D that are in accordance with the methods of the present invention. DIMM 23A through 23D are used within a microprocessor system 200 that has a standard MEMORY CLOCK DRIVER 5 that provides CLK signals 14 that are nominally in-phase with MCLK 9 (at the receiver end of each signal transmission line). Embodiments 23 A through 23D provide a first desired phase-offset relationship between CLK 14 and SCLK 25 for read cycles and a second desired phase-offset relationship between CLK 14 and SCLK 25 for write cycles. Each DIMM 23A through 23D has eighteen SDRAM 26. Nine SCLK(8:0) 25 signals are provided where each SCLK signal 25 is received by two SDRAM 26.

Embodiments 23A through 23D use an external printed wiring board (PWB) signal trace FB 35 to approximate the signal propagation delay from CLKout(8:0) 34 to each SDRAM 26 such that when SCLK(8:0) 25 is nominally in-phase (at the receiver end), with CLK 14 (at the point received by the CLOCK DRIVER 20), then SCLK(8:0) 25 (at the driver end) precedes CLK 14 by a length of time approximately equal to the propagation time through the trace FB 35. The geometry of FB 35 trace and an optional cap (not shown) from the trace to ground are selected to closely approximate the average propagation time (or flight time) each trace of each CLKout(8:0) 34 signal.

CONTROL signals 39 initiate bus cycles, determine the type of operation performed by each bus cycle, and provide synchronization information. CONTROL signals 39 include write enable /WE, clock enable CKE, chip selects /S0 and S1, data mask DQMB, row address strobe /RAS, and column address strobe /CAS. Select CONTROL signals 39 are received by CLOCK DRIVERS 20A–20C for tracking bus cycles. During each read cycle, detected by the CLOCK DRIVER 20 on the selected DIMM, SCLK(8:0) is adjusted to be in-phase (at the point each signal is received by an SDRAM 26 within an accuracy limited to + or −1 ns) with CLK 14. During each write cycle, detected by the CLOCK DRIVER 20 on the selected DIMM, the SCLK(8:0) 25 is adjusted to have phase-offset in relationship to CLK 14 having a magnitude of t2. Alternately, the second preferred embodiment of a DIMM 23B shown in FIG. 6 provides for SCLK 25 to have a selectable first phase-offset from CLK 14 for read cycles and a selectable second phase-offset from CLK 14 for write cycles.

Figure 5:
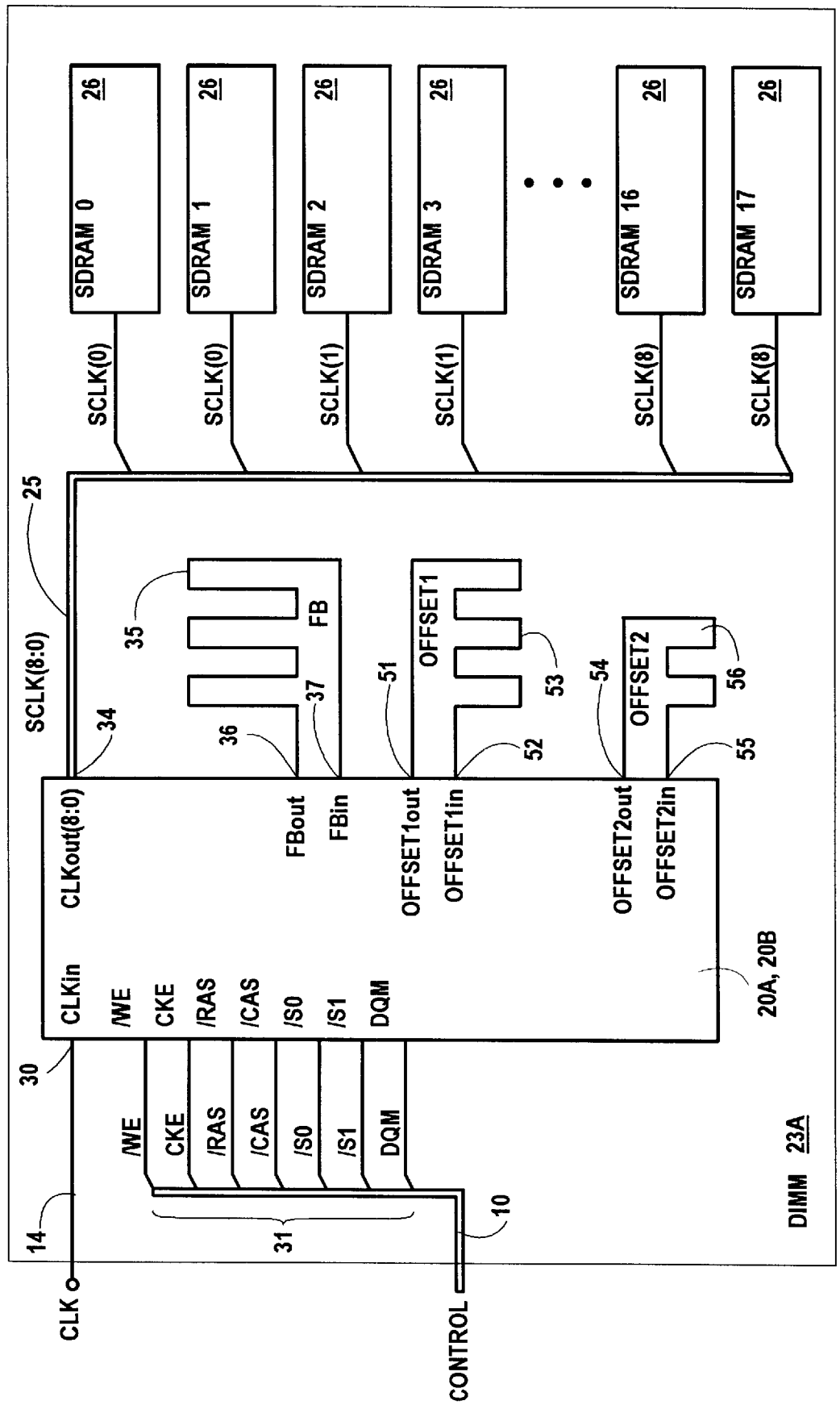
FIG. 5—A schematic block diagram for explaining a first embodiment of a memory module (DIMM) of the present invention.

The first preferred embodiment of a DIMM 23A shown in FIG. 5 uses two external traces to determine the nominal desired t2 amount of time that SCLK(8:0) is delayed from CLK 14. The geometry of OFFSET1 53 trace is selected to determine the desired magnitude of the phase-offset in the range of 50 pico seconds to ⅛ the nominal period of CLK 14. Alternately, a resister-capacitor network, or an accurate delay circuit, can provide the desired delay t2. The geometry of OFFSET2 56 trace is selected to be half of the propagation time t2 to provide an intermediate switch time t30,t35 to maintain close to a 50% duty cycle on SCLK(8:0) 25 in each clock period.

Figure 6:
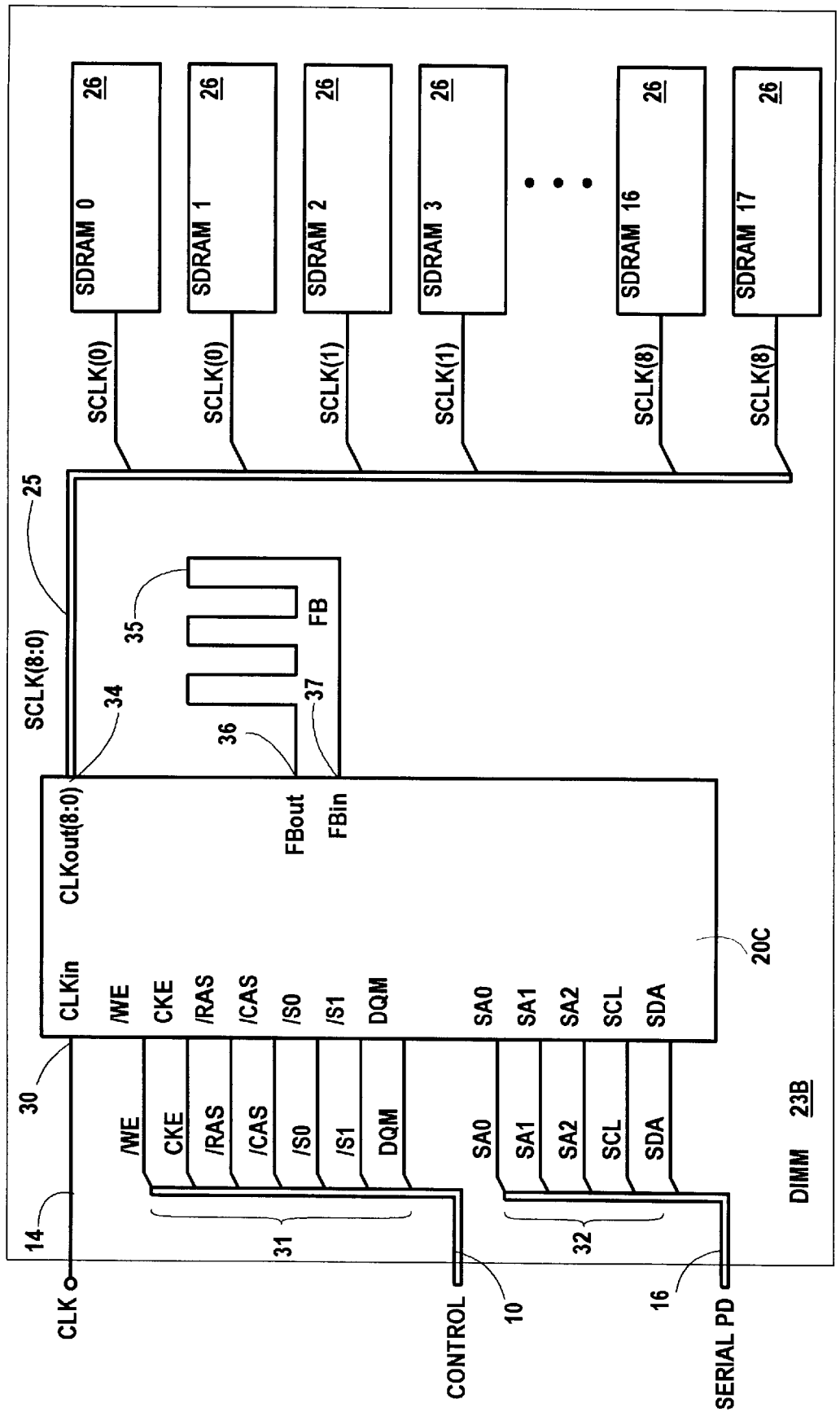
FIG. 6—A schematic block diagram for explaining a second embodiment of a memory module (DIMM) of the present invention.

The second preferred embodiment of a DIMM 23B as shown in FIG. 6 has SERIAL PD signals 16 for communication between the MPU 1 and the clock driver 20C. SERIAL PD signals 16 includes SCL clock line and an SDA data line that conform to the I2C-2-wire protocol. SA0–SA2 are hardwired either high or low to provide a unique slot address 0 through 8 to each DIMM 23,24. DIMM 23,24 specifications provide the SERIAL PD signals 16 as a means for the MPU 1 to communicate to the EPROM 19 on each DIMM 23. The SERIAL PD 16 signals may be used to read and write to each programmable CLOCK DRIVER 20C for selecting the read and write nominal phase-offset options. The CLOCK DRIVER 20C may have a device type that is different from the EPROM 19 and the CLOCK DRIVER 20C on each DIMM 23 responds only to its unique assigned slot address one though 8.

Figure 7:
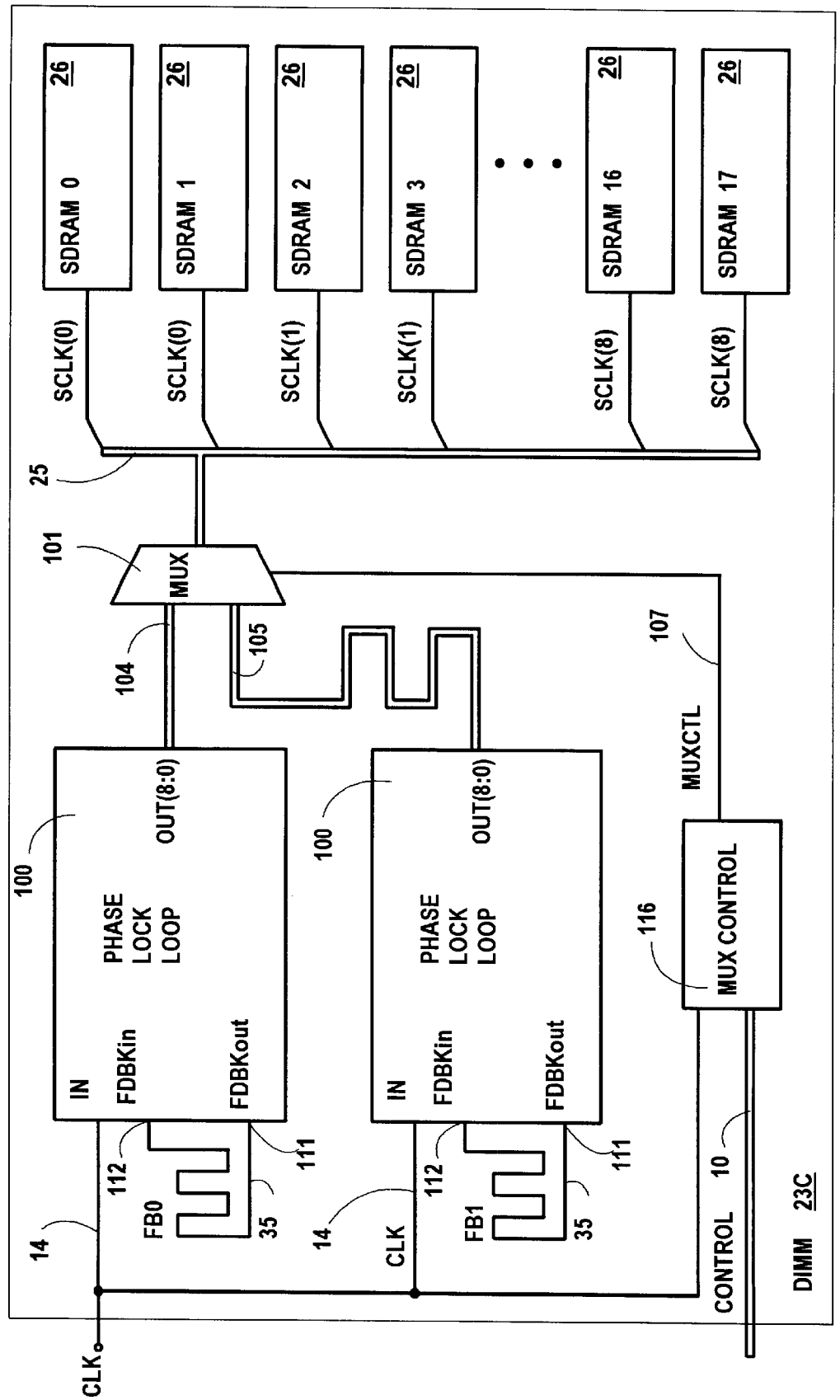
FIG. 7—A schematic block diagram for explaining a third embodiment memory module (DIMM) of the present invention.

The third preferred embodiment of a DIMM 23C as shown in FIG. 7 uses two standard PHASE-LOCK-LOOP (PLL) clock drivers 100A and 100B. Each PLL clock driver has a FB trace 35 for approximating the propagation time from OUT(8:0) of 100A to SCLK(8:0) (at the point each is received by an SDRAM 26). The group of signal traces 105 have lengths that are significantly longer than the length of signal traces 104. The difference in propagation time through traces 105 as compared to traces 104 determines the nominal t2 amount of time that SCLK(8:0) 25 is delayed (in relationship to CLK 14) on write cycles. Optionally, a third PLL driver 100 may be added to provide an intermediate switch time t30, t35, to maintain close to a 50% duty cycle on SCLK(8:0) 25 in each period. A MUX Control circuit receives the CONTROL 39 signals for tracking bus cycles and generates MUXCTL output signal 107 that controls an FET bus exchange switch 101 such as CBTLV16212. An appropriate bus switch is a two to one bus multiplexer that selects between two groups of input signals and has suitably fast switching time. The FET bus switch 101 selects signal 104 for read cycles and signals 105 for write cycles. Select clock signals may be used by MUX CONTROL 116 to synchronize the MUXCTL 107 signal and prevent glitches on the output. Alternately, the FET bus switch 101 can be eliminated by using PLL drivers 100 that have tri-state outputs and are each coupled to selectively drive SCLK(8:0) 25. In this alternate embodiment, MUX CONTROL 116 provides a signal to each PLL driver 100 that selects one PLL driver 100 to drive SCLK(8:0) signals 25 while the other one or more PLL drivers 100 have output signals OUT(8:0) set to a high-impedance state.

Figure 8:
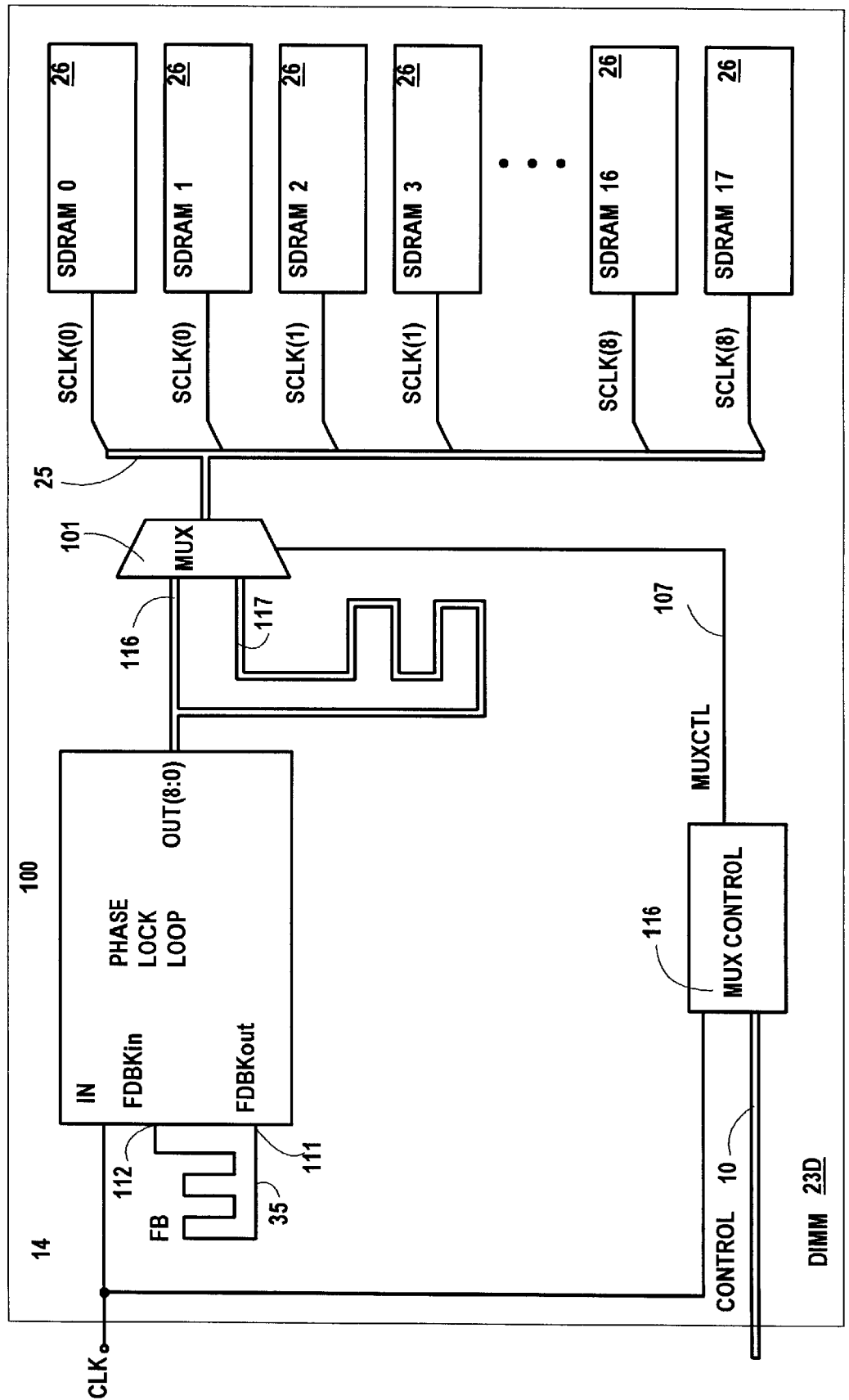
FIG. 8—A schematic block diagram for explaining a forth memory module (DIMM) of the present invention.

The forth embodiment of a DIMM 23D, as shown in FIG. 8, uses a single standard PLL clock driver 100 that drives two groups of output signals 116 and 117. The group of signal traces 117 each have lengths that are significantly longer than the length of each signal trace 116. The difference in propagation time through 117 as compared to 116 determines the nominal t2 amount of time that SCLK(8:0) 25 is phase-shifted on write cycles. Optionally, a third group of traces can be added to provide an intermediate switch time, t30, t35, to maintain close to 50% duty cycle on each SCLK(8:0) 25 period. A MUX Control circuit receives the control 39 signals to track bus cycles and generates MUX CTL output that controls an FET Bus exchange switch 101 such as CBTLV16212. The FET bus switch 101 selects signals 116 for read cycles and signals 117 for write cycles. Select clock signals are received by MUX CONTROL 116 to synchronize the MUXCTL 107 signals and prevent glitches on SCLK(8:0) 25.

Figure 9:
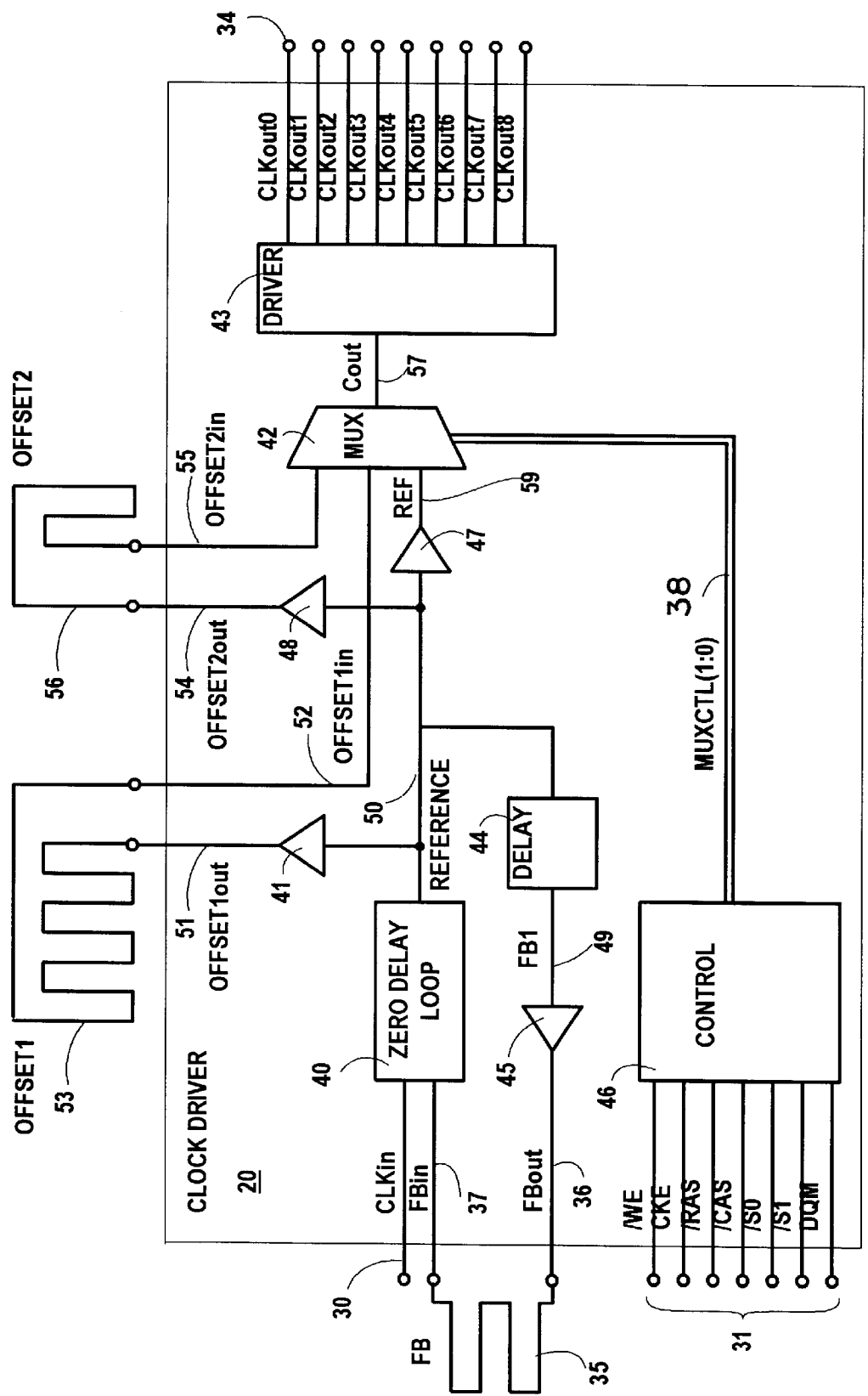
FIG. 9—A schematic block diagram for explaining a first phase clock driver of the present invention.
Figure 10A:
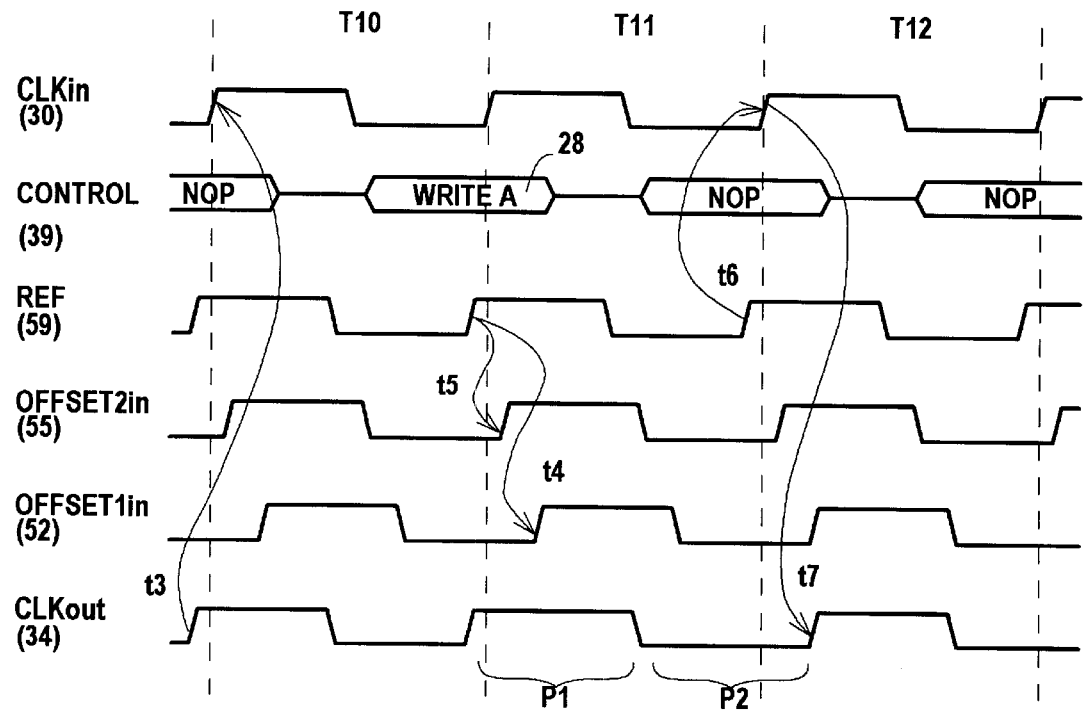
FIGS. 10A and 10B—Timing diagrams for explaining a clock driver of the present invention.
Figure 10B:
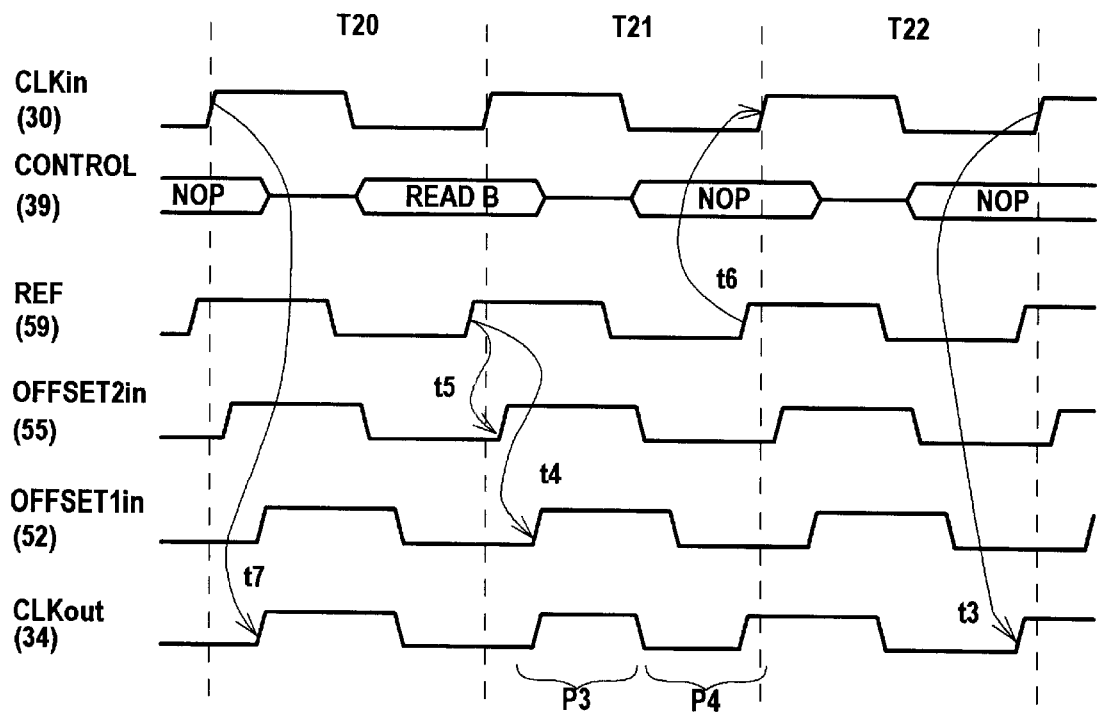

FIG. 9 shows a first embodiment of CLOCK DRIVER 20A of the present invention that provides CLKout(8:0) that is nominally in-phase with CLKin 30 for read cycles and has two PWB traces OFFSET1 53 and OFFSET2 56 for determining the desired nominal phase-offset t2 relationship of CLKout(8:0) 34 for write cycles. FIGS. 3, 10A and 10B show operations of the present invention. FIG. 10A shows the transition of CLKout(8:0) from read timing to write timing and FIG. 10A shows the transition of CLKout(8:0) from write timing to read timing. A ZERO-DELAY-LOOP circuit 40 receives input clock signal CLKin 30 and feedback signal FBin 37, and provides a controllable delay to the input clock signal CLKin 30 to produce an internal reference clock signal REFERENCE 50. When the ZERO-DELAY-LOOP circuit 40 detects a difference between the phase of CLKin 30 and FBin 37, the circuit enters an unlocked state. In the unlocked state, the ZERO-DELAY-LOOP circuit 40 continuously adjusts the phase-offset of REFERENCE 50 until CLKin 30 and FBin 37 are detected to be nominally in-phase. When CLKin 30 and FBin 37 are nominally inphase, the ZERO-DELAY-LOOP circuit 40 enters a locked state where the phase-offset of REFERENCE 50 in relationship to CLKin 30 stays constant. The ZERO-DELAY-LOOP circuit 4 is implemented using a phase-lock-loop circuit having lowjitter. Methods for implementing phase-lock-loop circuits are well known in the art. Delay circuit provides a desired delay to REFERENCE 50 to produce FB1 49. Output driver 45 transfers signal FB1 49 to the external trace FB 35 that connects output pin FBout 36 to FBin 37. The geometry of external trace FB 35 is selected to have a propagation time t3 that approximates the propagation time of each external trace connected between CLKout(8:0) 34 signals and the target SDRAM 64. Buffer 47 provides a delay that is designed to match the delay through matched output buffers 41 and 48. Matched transistors and passive elements and/or laser trimming of passive elements at manufacturing time can be used to insure delays through the various paths are matched as desired. The accumulative of delays through DELAY circuit 44 and output driver 45 is designed to closely match the accumulation of delays through the circuit 47, the multiplexer MUX 42, and the output driver 43. In this embodiment FBin 37 is not dependent on feedback from any of the output signals CLKout(8:0) 34 substantially diminishing the possibility for the ZERO-DELAY-LOOP circuit 40 intermittently leaving a locked state when an EM1 surge or noise glitch on the power supply couples over to the outputs CLKout(8:0) 34. This susceptibility to noise is increased with fine pitch packaging that has diminished spacing between clock signals and multi-signal busses. REF 59 precedes CLKin 30 by t6 amount of time that is set equal to the accumulation of delays through MUX 42, Cout 57, output driver 43, and the propagation time t3 through FB trace 35. Buffer 41 transfers REFERENCE 50 to OFFSET2out 51. The geometry of OFFSET1 PWB trace 53 is selected to provide a delay t4 (same as t2 of FIG. 3) that approximates the phase-offset of CLKout(8:0) in relation to CLKin 30 when the CLOCK DRIVER 20A is in a write timing state. Buffer 48 transfers REFERENCE 50 to OFFSET2out 56. The geometry of OFFSET2 PWB trace 56 is selected to provide delay t5 that is half the t4 delay through OFFSET1 53. CONTROL circuit 46 drives MUXCTL 38. MUXCTL 38 determines which input to multiplexer MUX 42, either REF 59, OFFSET1in 52, or OFFSET2in 55, is routed to Cout 57 and driven by output DRIVER 43 to CLKout(8:0) 34. CONTROL circuit 46 receives CONTROL input signals 31 for tracking bus cycles and receives internal clock signals including CLKin 30 for synchronization.

FIG. 10A shows the transition from a read-timing state to a write-timing state. In period T10 of FIG. 10A, CONTROL circuit 46 is in a read timing state where CLKout 34 is nominally in-phase with CLKin 30. In this state the MUX-CTL 38 selects REF 59 to be routed to CLKout 34. CLKout 34 (at the point is received by the SDRAM 26) is nominally in-phase with CLKin 30. FIG. 10A shows CLKout 34 (at the point it is driven) as preceding CLKin 30 by t3 amount of time (which is determined by the propagation time from FBout 35 to FB in 37). In period T10 a burst write command is detected by CONTROL inputs 31 signals having /S0 or /S1 low, and both /CAS and /WE low while /RAS is held high at the rising edge of period T11. In period T11 CONTROL circuit 46 enters a read-to-write transition state where, in the first phase P1 of T11 MUXCTL 38, signals select OFFSET2in to be routed to CLKout 34 resulting in the next falling edge of CLKout 34 being delayed by t5–t3 amount of time in relation to CLKin 30. In the second phase P2 of T11, MUXCTL signals 38 select OFFSET1in 52 to be routed to CLKout 34 resulting in the next falling edge being delayed by t7 (t7=t4–t3) amount of time in relation to CLKin 30. In period T12, CONTROL circuit 46 enters a write timing state where CLKout 34 has a nominal phase-offset from CLKin 30 of t7 amount of time.

FIG. 10B shows the transition from a write timing state to read timing state. In period T20, CONTROL is in a write timing state where CLKout 34 is delayed by t7 amount of time from CLKin 30. In period T20, a burst read command is detected on CONTROL inputs 31 by having /S0 or /S1 low, and /CAS low while /RAS and /WE are held high at the rising edge of period T21. In T21 CONTROL 46 enters a write-to-read transition state where in the first phase P3 of T21 MUXCTL 38 signals select OFFSET2in to be routed to CLKout 34 resulting in the next falling edge of CLKout 34 being delayed by (t5–t3) amount of time in relation to CLKin 30. In the second phase P4 of T21, MUXCTL 38 signals select REF 59 to be routed to CLKout resulting in the next falling edge preceding CLKin 30 by t3 amount of time. In T22, CONTROL circuit 46 enters a read- timing- state where CLKout 34 (at the point received by SDRAM 26) is nominally in-phase with CLKin 30.

Figure 11:
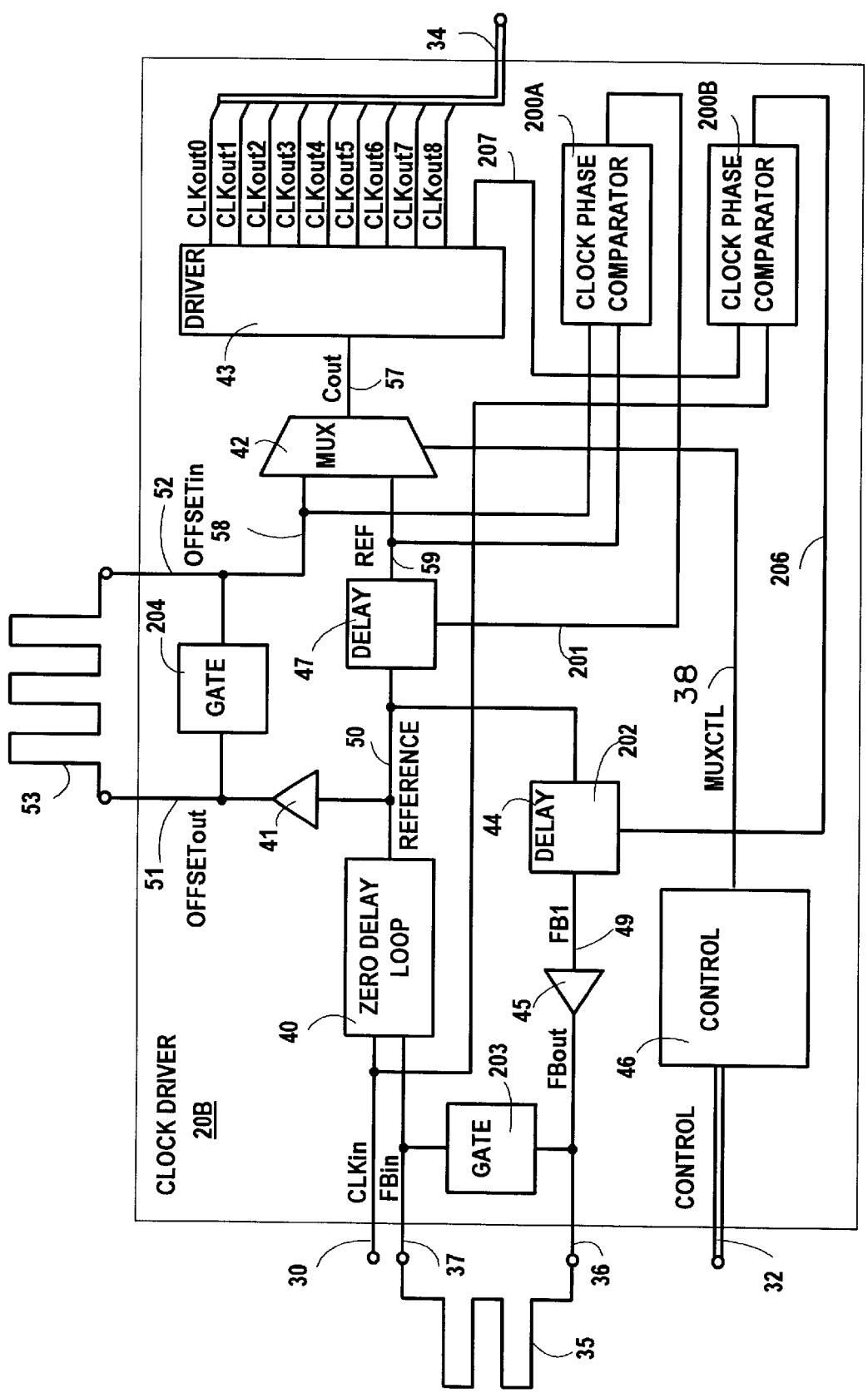
FIG. 11—A schematic block diagram for explaining a second clock driver of the present invention with self calibration support.

FIG. 11 is for explaining a method of the present invention for self-calibration of the clock driver 20A of FIG. 9 for increased precision and to compensate for the effects of temperature variations. This method can be applied to the other embodiments of the present invention. A self-calibration is typically executed at power up or as a result of a command to the device after the system has reached a stable operating temperature. The preferred embodiments provide a SERIAL PD interface 32 for the MPU1 to send a command to the CLOCK DRIVER 20B. Calibration involves the use of CLOCK-PHASE-COMPARATOR 200A, 200B, and variable delay buffers 44,47 and ZERO-DELAY-GATES 203,204. A CLOCK-PHASE-COMPARATOR 200A,200B or phase-detector is a device that is well known in the art that detects the difference in-phase between two input clock signals and produces an output signal 201,206 indicative of the phase difference. Variable delay circuits 44, and 47 respond to output signals 201,206 by adjusting the signal propagation delay through the buffer. Variable delay buffers 44,47 are well known in the art and can be implemented by a series of buffers, resister-capacitor circuits, or precision delay circuits that may have high frequency clocks and counters.

Self-calibration involves two consecutive states. In the first calibration state, a GATE 204 is activated that closely approximates a zero delay short between OFFSEToutput 51 and OFFSETin 52. MUX inputs 58 and 59 are received by a CLOCK-PHASE-COMPARATOR 200A. The minimal delay through GATE 204 is matched with a similar GATE connecting the output of delay 47 to the input to the clock phase comparator 200A. In the first calibration state, variable delay buffer 47 responds to output 201 until the two inputs 58, 59 to the multiplexer 42 are in-phase. The delay through 47 is locked when the first calibration state is exited. In the second calibration, state MUXCTL 38 selects the REF 59 to be driven on to Cout 57, and GATE 203 is activated to closely approximate a short between FBout 36 and FBin 37. The minimal delay through GATE 203 can be accurately matched with a similar gate connecting the output of CLKin 40 to the input to the clock phase comparator 200B. CLKin 30 and an output 207 from the output driver 43 that closely approximates the waveforms on CLKout(8:0) 34 are received by CLOCK-PHASE-COMPARATOR 200B. Delay circuit 44 in this embodiment produces a delay between the input signal 50 and output signal 59 that is determined by the output 206 from CLOCK-PHASE-COMPARATOR 200B. The delay through circuit 44 is adjusted until CLKin 30 and driver output 207 are in-phase and then the second calibration state is exited and the CLOCK DRIVER 20B returns to normal operation.

Figure 12:
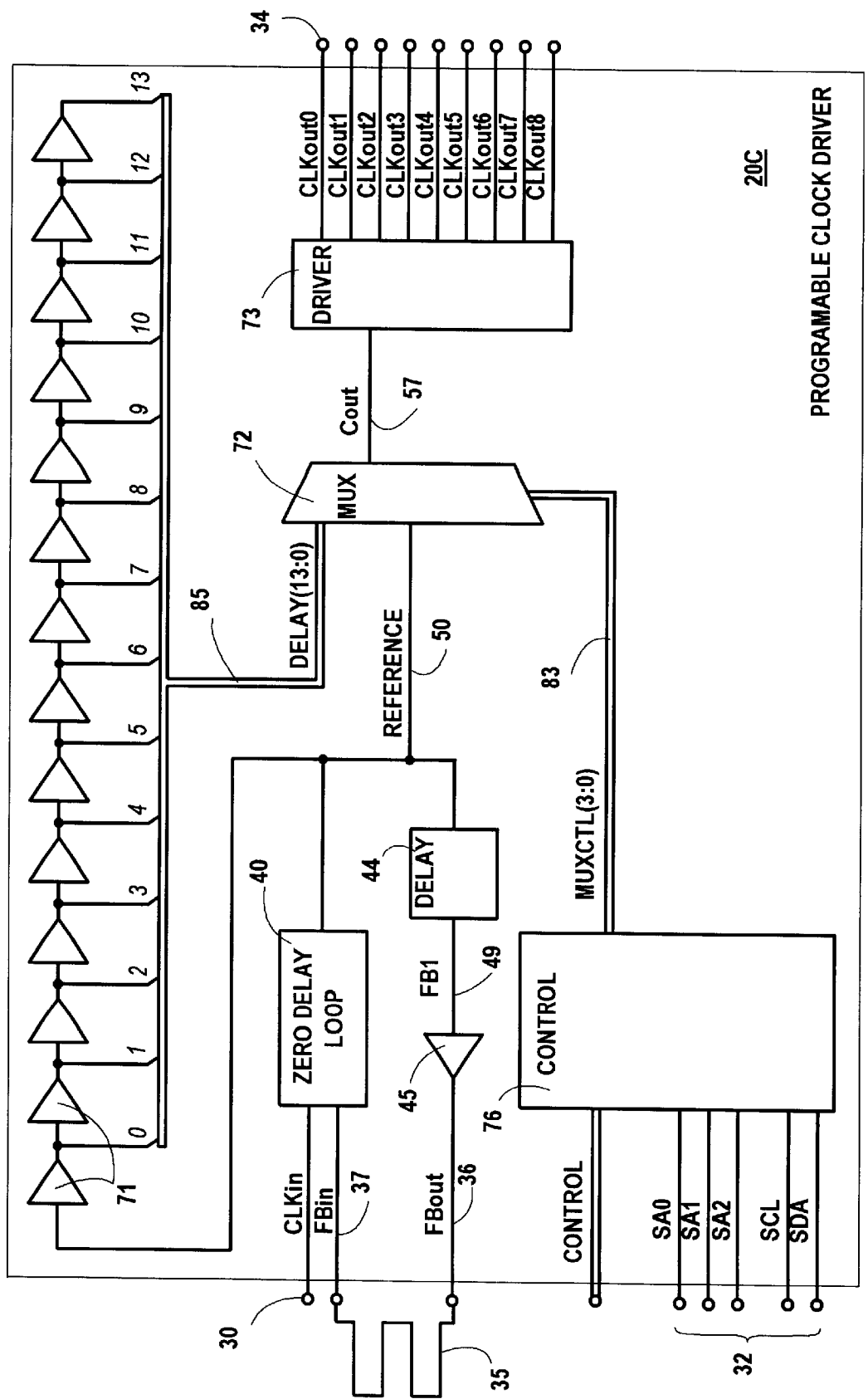
FIG. 12—A schematic block diagram for explaining a third phase clock driver of the present invention that is software programmable.

FIG. 12 shows a second preferred embodiment of a clock driver 20C of the present invention that can be programmed to have, in relationship to the input clock CLKin 30, a first desired phase-offset for read cycles, and a second desired phase-offset for write cycles. The primary difference between the second preferred embodiment 20C and the first embodiment 20A is the use of 14 precision delay circuits 71 in place of external traces OFFSET 1 38 and OFFSET 2 56 and the MUX 72 is expanded to have 15 inputs. The ZERO-DELAY-CIRCUIT 45, DELAY circuit 44, and output buffer 45 operate the same as analogous components of the first embodiment of 20A. Identical precision delay circuits 71 are connected in series to provide fourteen signals 85 having progressively increasing delayed versions on REFERENCE 50. The first precision delay circuit receives REFERENCE 50 and provides a delay to REFERENCE 50 signal to produce an output DELAY 85 signal. Each subsequent precision delay circuit 71 received the output DELAY 85 from the previous delay circuit 71 and provides a delay to produce one output DELAY signal 85. Each input signal to the multiplexer MUX 72, REFERENCE 50 and DELAY (13:0) 85, is one phase-offset option. A SERIAL PD 16 interface 32 provides an interface for a software program to select a phase-offset option for read cycles and a phase-offset option for write cycles. CONTROL circuit 46 receives select internal clock signals as well as CLKin 30 for synchronization. For each phase-offset option, the CONTROL circuit 46 selects in the first phase P2 or P4 of each transition state the phase-offset option that best preserves a 50% duty cycle on CLKout 34 for that period T11 or T12. An alternate embodiment supports phase-offset options that result in CLKout 34 at the point received by the SDRAM 26, preceding CLKin 30. This alternate embodiment can have either DELAY circuit 44 that has a smaller delay then previously described or phase-offset options can include delays that are close to the period of CLKin 30.

The foregoing disclosure and description of the invention are described with reference to specific explanatory embodiments. It will be evident that modifications and changes may be made thereto without departing from the broader spirit and scope of the invention as set forth in the appended claims. The specification and drawings are, accordingly, presented by way of example only, and not limitation. Thus, the breath and scope of the invention should not be limited by the exemplary embodiments described herein, but should be defined only in accordance with the following claims and their equivalents.

We claim:

1. A clock driver for generating, from an input clock signal, an output clock signal having a phase-offset that is selectable for each output clock period, said clock driver circuit comprises:

a zero-delay-loop circuit coupled to receive said input clock signal, for delaying said input clock signal by a controllable quantum of time to generate a reference clock signal having a controllable phase-offset in relationship to said input clock signal;

a first delay circuit coupled to receive said reference clock signal, said first delay circuit providing an input feedback signal derived by delaying said reference clock signal by a first quantum of time;

wherein said zero-delay-loop circuit receives said feedback signal, for determining the magnitude of said controllable quantum of time that said reference clock signal is delayed from said input clock signal, such that said input feedback signal is in-phase with said input clock signal;

one or more offset delay circuits, each offset delay circuit receiving said reference clock signal and providing an offset signal derived by delaying said reference clock signal by a desired quantum of time, and wherein said one or more offset signals are offset in time from one another and said reference signal; and a multiplexer coupled to receive said reference signal and said one or more offset signals, for routing one of said received signals to an output clock signal.

2. The clock driver of claim 1, further comprising:

one or more registers for storing and generating a one or more value signals;

wherein each said one or more offset delay circuits receives said value signal for determining the magnitude of said desired quantum of time that said respective offset signal is delayed from said reference signal; and wherein said value signals are determined by a software command.

3. The clock driver of claim 1:

wherein said multiplexer is responsive to one or more mux-control signals that determine which one of said multiplexer received signals is routed to said output clock signal; and said clock driver is further comprised of a state machine circuit for providing said one or more mux-control signals, wherein said state machine circuit receives one or more control signals and selectively stores said control signals, for determining said mux-control signals.

4. The clock driver of claim 3:

wherein said state machine circuit is comprised of a plurality of state signals having a read cycle state and a write cycle state, said state signals are determined by said state signals and said received control signals;

said clock driver is further comprised of a first register for storing and generating said one or more read value signals, and a second register for storing and generating one or more write value signals;

wherein said first register and said second register have means for receiving a variable software command, and said read value signals and said write value signals are determined by said variable software commands;

wherein when said state signals are in a read state, said read value signals determine said mux-control signals; and wherein when said state signals are in a write state, said write value signals determine said mux-control signals.

5. The clock driver of claim 1, wherein:

said first delay circuit is further comprised of a second variable delay circuit for delaying said reference signal by a second quantum of time to produce an output feedback signal, said first delay circuit is further comprised of a first long transmission line disposed between said output feedback signal and said input feedback signal, and wherein said long transmission line is comprised of an elongated conductive material and wherein the geometry of said long transmission line is selected to delay said feedback output signal by a constant quantum of time to produce said feedback input signal.

6. The clock driver of claim 5 having self calibration of an internal delay circuit, further comprised of:

a control circuit for producing a calibration control signal having a first state and a second state;

a gate disposed between said input feedback signal and said output feedback signal, said gate is responsive to said calibration control signal, wherein when said calibration control signal is in said first state, said feedback output signal is electrically coupled to said feedback input signal, and when said calibration control signal is in said second state, said feedback output signal is electrically disconnected from said feedback input signal;

a phase comparator circuit coupled to receive said output clock signal and said input clock signal, for producing a comparator output signal that is indicative of the phase-offset between said output clock signal and said input clock signal; and wherein said second variable delay circuit is responsive to said comparator output signal and said calibration control signal, wherein when said calibration control signal is in said first state, said second quantum of time is determined in accordance with said comparator output signal such that said output clock signal and said input clock signal are in-phase, and when said calibration control signal is in said second state, said second quantum of time is fixed.

7. The clock driver of claim 1, further comprised of:

wherein each said one or more offset delay circuits is further comprised of an external transmission line disposed between said reference signal and each said offset signal, wherein each said external transmission line is comprised of an elongated conductive material, and wherein the geometry of each said long transmission lines is selected for determining said desired quantum of time that said respective offset signal is delayed from said reference signal.

8. A clock driver for generating, from an input clock signal, an output clock signal having a phase-offset that is controllable, said clock driver circuit comprises:

a zero-delay-loop circuit coupled to receive said input clock signal having a periodic wave form, for delaying said input clock signal by a controllable quantum of time to generate a first reference clock signal;

a first delay circuit disposed between said first reference clock signal and a feedback input signal for delaying said first reference clock signal by a first quantum of time to produce said feedback input signal;

wherein said zero-delay-loop receives said feedback input signal and adjusts the controllable quantum of time that said first reference signal is delayed from said input clock signal;

a second offset delay circuit disposed between said first reference clock signal and an input offset signal for delaying said first reference clock signal by a second quantum of time to produce said input offset signal;

a third delay circuit disposed between said first reference clock signal and a second reference signal for delaying said first reference clock signal by a third quantum of time to produce said second reference signal; and a multiplexer coupled to receive said second reference signal and said input offset signal, for routing one of said received signals, said second reference signal and said offset signal, to an output clock signal.

9. The clock driver of claim 8, having self calibration of an internal delay circuit, said clock driver is comprised of:

a control circuit for providing a calibration control signal having a first state and a second state;

wherein said second delay circuit is comprised of an output buffer for transferring said first reference to an output offset signal;

said second offset delay circuit is further comprised of a fourth delay circuit disposed between said output offset signal and an input offset signal for delaying said output offset signal by a fourth quantum of time to produce said input offset signal;

a gate disposed between said output offset signal and said input offset signal, said gate is responsive to said calibration control signal, wherein when said calibration control signal is in said first state, said output offset signal is electrically coupled to said input offset signal, and when said calibration control signal is in a second state, said output offset signal is electrically disconnected from said input offset signal;

a phase comparator circuit coupled to receive said input offset signal and said second reference signal, for providing a comparator output signal indicative of the difference in-phase between said input offset signal and said second reference signal; and wherein said third variable delay circuit is responsive to said calibration control signal and said comparator output signal, and wherein when said calibration control signal is in said first state, said second quantum of time is determined in accordance with said comparator output signal such that said input offset signal and said second reference signal are in-phase, and wherein when said calibration control signal is in said second state, said third quantum of time is fixed.

10. A memory module having a local clock signal with a controllable phase-offset in relationship to a system clock signal provided for synchronization of data transfers, comprising:

a phase-lock-loop circuit coupled to receive a system clock signal having a periodic waveform, for generating a first reference clock signal having a first desired phase-offset in relationship to said system clock signal;

a delay circuit disposed between said first reference signal and a second reference signal for delaying said first reference signal by a desired quantum of time to produce said second reference signal;

a multiplexer coupled to receive said first reference signal and said second reference signal, for routing one of said received signals, said first reference signal and said second reference signal to a local clock signal.

11. The memory module of claim 10 wherein:

said delay circuit is comprised of a long transmission line comprised of elongated conductive material disposed between said first reference signal and said second reference signal, wherein said geometry of said long transmission line is selected to delay said first reference signal by said desired quantum of time.

12. A data communication system having a local clock signal with a controllable phase-offset in relationship to a system clock signal provided for synchronization of data transfers over a multi-signal communication bus, comprising:

a first phase-lock-loop circuit coupled to receive a system clock signal having a periodic waveform, for generating a first reference clock signal having a first desired phase-offset in relationship to said system clock signal;

a second phase-lock-loop circuit coupled to receive said system clock signal, for generating a second reference clock signal having a second desired phase-offset in relationship to said system clock signal, wherein said second reference clock signal is offset in time from said first reference signal;

a multiplexer coupled to receive said first reference signal and said second reference signal, for routing one of said received signals, said first reference signal and said second reference signal, to a local clock signal.

* * * * *